(12) United States Patent
Schultz et al.

(10) Patent No.: US 6,219,749 B1
(45) Date of Patent: *Apr. 17, 2001

(54) CONTENT ADDRESSABLE MEMORY SYSTEM WITH SELF-TIMED SIGNALS AND CASCADED MEMORIES FOR PROPAGATING HIT SIGNALS

(75) Inventors: Kenneth James Schultz, Kanata; Farhad Shafai; Garnet Frederick Randal Gibson, both of Nepean, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/501,583

(22) Filed: Feb. 10, 2000

Related U.S. Application Data

(63) Continuation of application No. 08/923,633, filed on Sep. 4, 1997, now Pat. No. 6,122,707.

(51) Int. Cl.$^7$ .............................. G06F 13/00; G11C 15/00
(52) U.S. Cl. .............................. 711/108; 365/49; 365/210
(58) Field of Search .............................. 711/108, 5, 167; 365/49, 210, 230.03, 230.06, 233

(56) References Cited

U.S. PATENT DOCUMENTS

| | | | |
|---|---|---|---|
| 4,670,858 | * 6/1987 | Almy ....................................... | 365/49 |
| 5,018,111 | * 5/1991 | Madland ................................. | 365/233 |
| 5,289,403 | * 2/1994 | Yetter ...................................... | 365/49 |
| 5,568,416 | * 10/1996 | Kawana et al. ......................... | 365/49 |
| 5,828,593 | * 10/1998 | Schultz et al. .......................... | 365/49 |
| 5,859,791 | * 1/1999 | Schultz et al. .......................... | 365/49 |

OTHER PUBLICATIONS

K.J. Schultz et al, "Architectures for Large Capacity CAM's" INEGRATION: the VLSI Journal, vol. 18, 1995, pp. 151–171.*

Moors et al, "Cascading Content Addressable Memories," IEEE Micro, vol. 12, No. 3, Jun. 1992, pp. 56–66.*

"Self–Timed Hit Circuit for a Content Addressable Memory," IBM Tech. Disc. Bull., vol. 38, No. 2, Feb. 1995, pp. 65–66.*

Yamagata et al, "A 288–Kb Fully Parallel Content Addressable Memory Using a Stacked Capacitor Cell Structure," IEEE Jour. Sol. St–Ccts., Dec. 1992, pp. 1927–1933.*

* cited by examiner

*Primary Examiner*—Glenn Gossage
(74) *Attorney, Agent, or Firm*—Angela C. de Wilton

(57) ABSTRACT

A system includes a plurality of content addressable memory (CAM) arrays and a plurality of logic circuits which are connected to a commonly shared bus. Each CAM array provides search results (hit, match address and multiple match) in a search operation in response to a clock signal. Hit, match address and multiple match signals are provided from the CAM arrays to the logic circuits which are associated with the CAM arrays. The hit signals provided from the CAM arrays are propagated from upstream to downstream logic circuits in response to a self-timed signal which is delayed in time from the clock signal. The logic circuits prevent more than one match address signal provided from the CAM array from being transferred simultaneously to the commonly shared bus. The multiple match signals provided from the CAM arrays are propagated from upstream to downstream logic circuits. By observing the propagated hit and multiple match signals provided from the furthest downstream logic circuit and the match address signal on the commonly shared bus, a hit result of the system in a search operation is provided.

12 Claims, 3 Drawing Sheets

CONTENT ADDRESSABLE MEMORY SYSTEM WITH SELF-TIMED SIGNALS AND CASCADED MEMORIES FOR PROPAGATING HIT SIGNALS

This application is a continuation of application Ser. No. 08/923,633, filed Sep. 4, 1997, now U.S. Pat. No. 6,122,707.

TECHNICAL FIELD

The present invention relates to a content addressable memory (CAM) system in which a plurality of CAM arrays are cascaded.

BACKGROUND INFORMATION

Content addressable memories (CAMs) are known. In CAMs, data is selected based on contents, rather than physical location. This function is useful for many applications, especially when performing a look-up for the purposes of mapping. This operation is required in many telecommunications (telecom) functions, including Asynchronous Transfer Mode (ATM) address translation.

Often, system storage requirements exceed the number of entries stored on a single CAM array. Multiple CAM arrays, possibly on multiple chips, are then required, and it is necessary to cascade the multiple CAM arrays such that they may be searched as a single entity. An appropriate "user-friendly" cascading capability enables the same CAM array to be used in a range of systems with different capacity requirements, and allows for easy expandability and scalability, as well.

U.S. Pat. No. 5,568,416 granted to K. Kawana et al on Oct. 22, 1996 discloses an associative memory in which multiple CAM chips are cascaded by propagating a result address and status through all chips in the cascade. Each chip contains a status register for itself, and another for all upstream chips. It also discloses means of identifying the last device in the cascade, and separate storage areas for common and unique data entries.

SUMMARY OF THE INVENTION

It is an object of the present invention to provide an improved content addressable memory system.

According to one aspect of the present invention, there is provided a system comprising: a common bus; a plurality of content addressable memory (CAM) arrays, each CAM array comprising encoding means and an array of core cells, of w words×b bits, associated with the encoding means, each CAM array being able to provide, through its respective encoding means, a hit signal and a match address signal resulting from a search operation in response to a clock signal; and a plurality of logic circuits, each logic circuit being associated with a respective CAM array to receive the hit signal and the match address signal provided therefrom. Each logic circuit comprises: (i) timing signal generation means for generating a self-timed signal in response to the clock signal; (ii) hit propagation circuit for providing a propagation-out hit signal to a downstream logic circuit, by logically combining: a propagation-in hit signal provided from an upstream logic circuit; the hit signal provided from the respective CAM array; and the self-timed signal provided from the timing signal generation means; and (iii) match address transfer circuit for transferring the match address signal provided from the respective CAM array to the common bus.

In the system according to the present invention, the hit, match address and multiple match signals are provided from the CAM arrays to the logic circuits associated CAM arrays. The hit signals provided from the CAM arrays are propagated from upstream to downstream logic circuits in response to the self-timed signal. The logic circuits prevent more than one match address signal from being transferred simultaneously to the common bus. By observing the propagated hit signal provided from the furthest downstream logic circuit and the match address signal on the common bus, a hit result of the system in a search operation is provided.

According to the present invention, it is possible to implement a plurality of CAM arrays that has the same kind of search result outputs as a single CAM (e.g., hit, match address). It is thus possible that n CAM arrays, each with a capacity of w entries (or words), are integrated into a single multi-chip CAM system with n×w words.

According to another aspect of the present invention, there is provided a system wherein each of the plurality of CAM arrays is further able to provide, through its respective encoding means, a multiple match signal resulting from a search operation in response to the clock signal and each of the plurality of logic circuits further comprises a multiple match propagation circuit for providing a propagation-out multiple match signal to a downstream logic circuit, in response to the propagation-in hit signal provided from the upstream logic circuit, the hit signal provided from the respective CAM array, the multiple match signal provided from the respective CAM array and a propagation-in multiple match signal provided from the upstream logic circuit.

In the system, the multiple match signals provided from the CAM arrays are propagated from upstream to down stream logic circuits. For example, by observing the propagation-out multiple match signal provided from the furthest-downstream array, a multiple match status of the cascaded CAM arrays is provided.

BRIEF DESCRIPTION OF THE DRAWINGS

An embodiment of the present invention will now be described by way of example with reference to the accompanying drawings in which.

DETAILED DESCRIPTION

Figure 1:
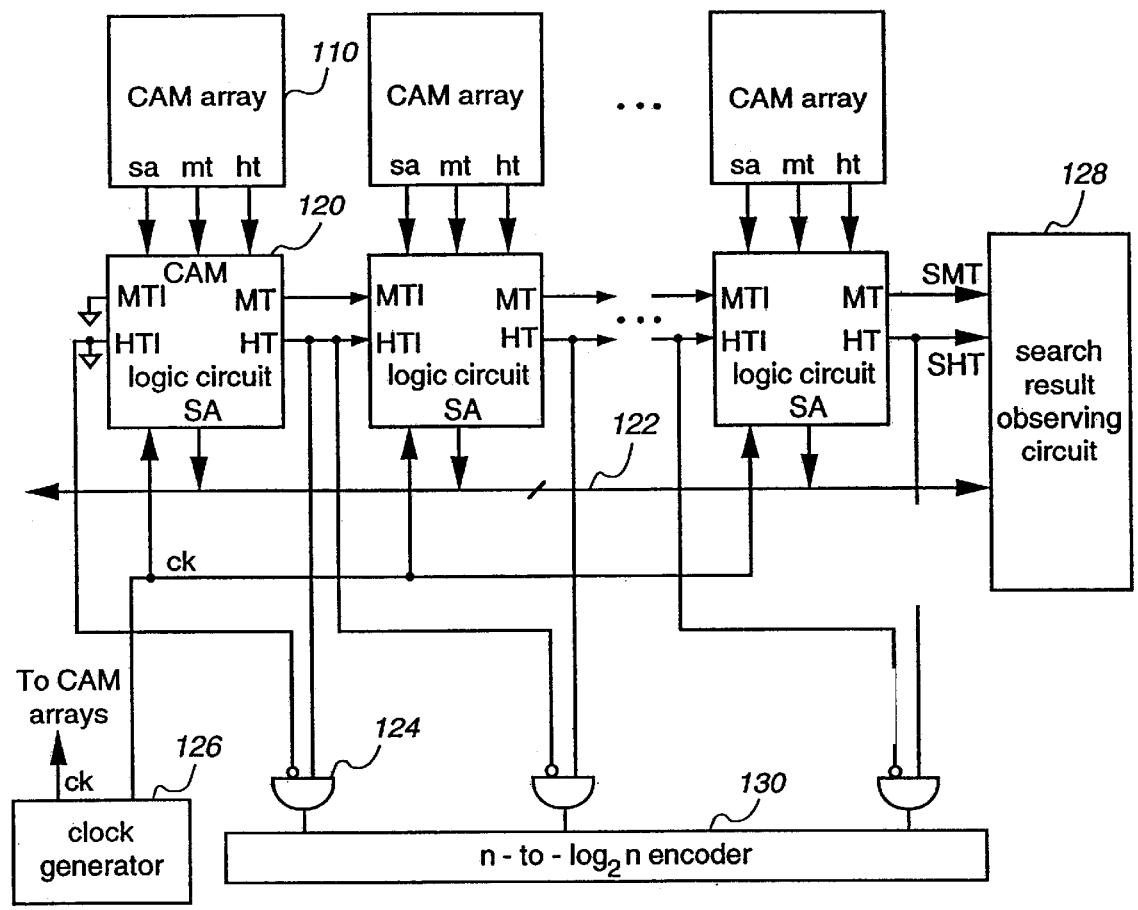
FIG. 1 is a block diagram of a system including a plurality of CAM arrays which are cascaded, according to an embodiment of the present invention.

Referring to FIG. 1 which shows a system according to an embodiment of the present invention, the system includes n CAM arrays 110 which are cascaded through n logic circuits 120. Each logic circuit 120 is associated with a respective CAM array 110 to receive hit, match address and multiple match signals ht, sa and mt therefrom; the timing of these three signals is known but not necessarily controllable. The logic circuit 120 has input terminals HTI and MTI for receiving propagation in hit and multiple match signals, respectively, from the upstream logic circuit 120. Both input terminals MTI and HTI of the furthest upstream logic circuit 120 are connected to logic 0 terminals. Also, each logic circuit 120 has output terminals HT and MT for providing propagation out hit and multiple match signals to the downstream logic circuit 120. An address output terminal SA of each logic circuit 120 is connected to a commonly shared bus 122. The system includes n AND gates 124. Each AND gate 124 has inverting and non-inverting input terminals. The hit input terminal HTI and hit output terminal HT of each logic circuit 120 are connected to the inverting and non-inverting input terminals of a respective AND gate 124. A clock generator 126 provides clock signals ck to the CAM arrays 110 and the logic circuits 120. The bus 122 and the hit and multiple match output terminals HT and MT of the furthest downstream logic circuit 120 are connected to a search result observing circuit 128. The output terminals of all of the AND gates 124 are connected to an n-to-$\log_2 n$ encoder 130.

Figure 2:
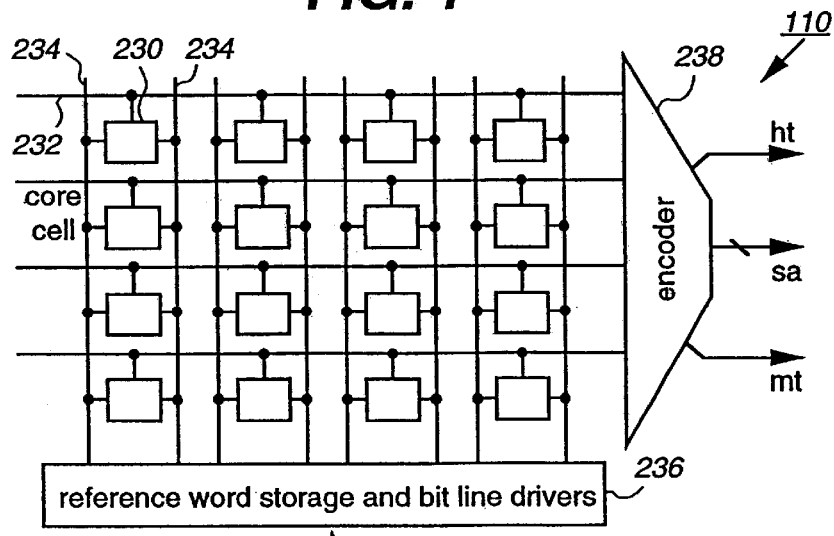
FIG. 2 is a circuit diagram of an example of a CAM array shown in FIG. 1.

Referring to FIG. 2 which shows an example of the CAM array 110 implemented with an array of w (=4) words (rows)×b (=4) bits (columns), the CAM array 110 includes w rows×b column of core cells 230. Each of the core cells 230 includes data storage means (not shown) and is at the intersection of a match line 232 and a pair of bit lines 234. A pair of bit lines 234 carrier differential data representing a single bit, rather than two bits of data. Each of the core cells 230 acts to store a single bit of data and is capable of performing a single-bit comparison (logical exclusive NOR (XNOR)) operation, in addition to its bit storage capability. The bit lines 234 for differential data are connected to reference word storage and bit line drivers 236 which receive input data D for loading the contents of the CAM array and for the search reference word. The CAM array 110 includes an encoder 238 which is connected to the match lines 232. The structure of the CAM array is known. See a paper by K. J. Schultz et al. entitled "Architectures for Large-Capacity CAMs", INTEGRATION: the VLSI Journal, Vol. 18, pp. 151–171, 1995, which is incorporated herein by reference.

The CAM array is not limited to one shown in FIG. 2. There are many variations. For example, the data comparison function of a CAM array may not be performed by the core cells, but may be performed by separate comparators placed adjacent to the core cells. Such a CAM array is described in U.S. patent application Ser. No. 08/748,928 entitled "Large-Capacity Content Addressable Memory", filed on Nov. 14, 1996 by K. J. Schultz et al, now U.S. Pat. No. 5,828,593, which is incorporated herein by reference. Also, a core cell array of a CAM array may be chained as described in U.S. patent application Ser. No. 08/923,823 entitled "Content Addressable Memory", filed on Sep. 4, 1997 by K. J. Schultz et al, now U.S. Pat. No. 5,859,791, which is incorporated herein by reference.

Referring to FIGS. 1 and 2, in response to the clock signal ck provided from the clock generator 126, when differential data is asserted on a pair of bit lines 234 in a search operation, the core cell 230 compares its stored data bit with this differential data (also known as reference data, or a single bit of the comparand). When the stored data is not equal to the reference data, the core cell 230 pulls the match line 232 (which is precharged to a logical high state) down to a low state. When the stored data is equal to the reference data, the core cell 230 has no effect on the match line 232 to which it is connected. Because all of the b core cells 230 in a given word are connected to the match line 232 in the same way, the match line 232 will be pulled low if any bit in its word is unequal to (or mismatches) a corresponding reference bit of the reference data. The match line 232 remains in a logical high state only if all bits in its of the reference data word match their corresponding reference bits.

Each of the CAM arrays 110 is able to provide search results (i.e., hit, match address and multiple match signals ht, sa and mt), via the encoder 238, which are fed to the respective of the logic circuits 120. Each logic circuit 120 propagates the hit and multiple match results array-to-array and transfers the match address result to the commonly shared bus 122. The hit and multiple match results SHT and SMT of the system are available at the far right side (the furthest downstream logic current 120). An additional useful piece of status information is the ordinal location of the array that has driven its result onto the bus 122 (i.e., the highest-priority array with a match); this information is generated by the AND gates 124 and the encoder 130.

With reference to a single CAM array 110, the binary address of a matching word is encoded onto the "sa" output. In the event that a plurality of words have matched the reference data, the multiple match signal mt is asserted to a logical high state. In this event, the match address output of the encoder 238 may produce (a) an invalid result, (b) an address representing the location of a single one of the multiple matches, or (c) a sequence of outputs, representing the locations of each of the matched words. Note that some applications may not require the multiple match result, and all references to the multiple match function may be eliminated from this disclosure, without loss of utility.

Figure 3:
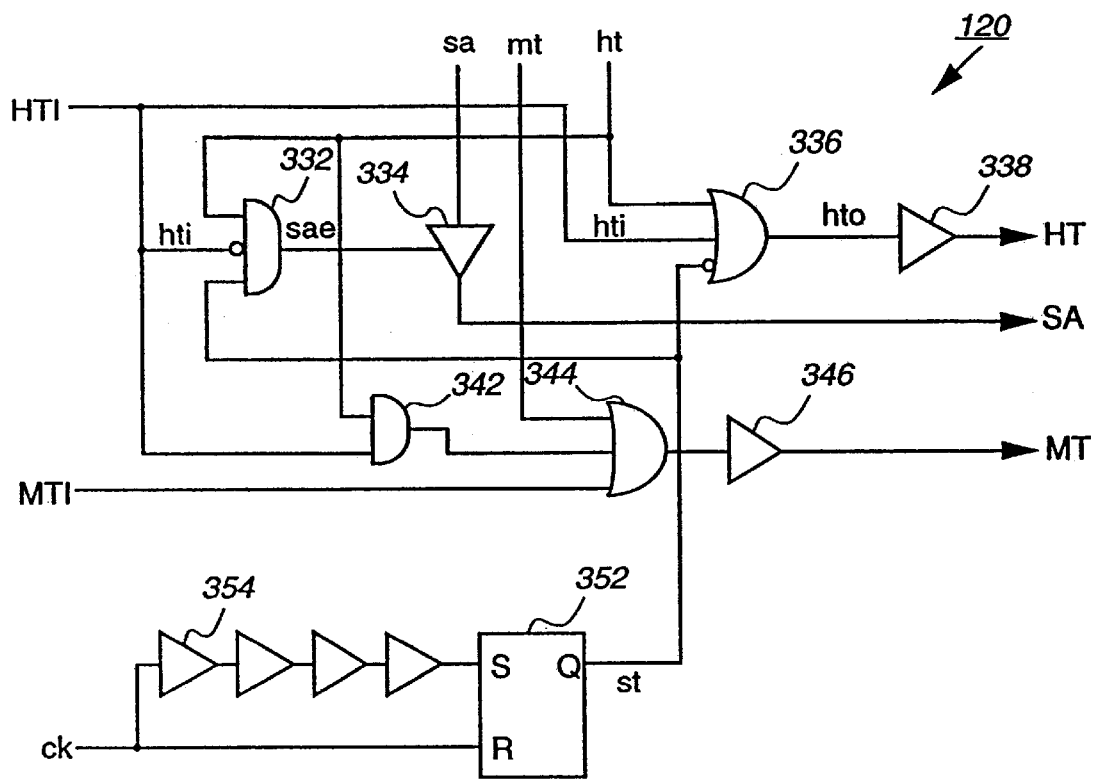
FIG. 3 is a circuit diagram of an example of a logic circuit shown in FIG. 1.

FIG. 3 is a circuit diagram of an example of the logic circuit 120. Because the CAM array 110 of the system shown in FIG. 1 provides the hit and multiple match search results, the logic circuit 120 propagates them in a similar way. One logic circuit 120 receives hit, match address and multiple match signals ht, sa and mt of a search result from the respective CAM array 110. The hit signal ht is fed to AND gates 332 and 342 and an OR gate 336. The match address signal sa is fed to the input terminal of a transfer gate 334, the output terminal of which is connected to the match address output terminal SA of the logic circuit 120. The multiple match signal mt is fed to an OR gate 344. The propagation-in hit signal hti provided from the upstream logic circuit 120 is fed to the AND gate 342, the OR gate 336 and the inverting input terminal of the AND gate 332, the output (a match address enable signal sae) of which is fed to a control input of the transfer gate 334. The multiple match input terminal MTI is connected to the OR gate 344. The output of the AND gate 342 is fed to the OR gate 344. The output of the OR gate 344 is fed to a buffer 346, the output terminal of which is connected to the multiple match output terminal MT of the logic circuit 120.

A self-timed signal st is generated by a self-timed signal generator. There are many possible embodiments of self-timed signal generators. It is the intended scope of this invention to subsume any such embodiment, provided the resulting self-timed signal st is employed as described above to enable contention-free result bus sharing.

Referring to FIG. 3, in one possible embodiment of a self-timed signal generator, the clock signal ck is fed to the reset input terminal R of a flip-flop 352. Also, the clock signal ck is fed to the set input terminal S of the flip-flop 352 through buffers 354. The self-timed signal st is provided from the Q output terminal of the flip-flop 352 to the AND gate 332 and the inverting input terminal of the OR gate 336. The falling edge of the self-timed signal st is generated by the rising edge of the clock signal ck, while the rising edge of the self-timed signal st is generated by a delayed version of the rising edge of the clock signal ck. Timing both edges of the self-timed signal st from the rising edge of the clock signal ck results in duty cycle independence. The delay of a delay chain can be set equivalent to the delay between the rising edges of the clock signal ck and the hit signal ht. Alternatively, if the duty cycle of the clock signal ck is known and well controlled, timing of the rising edge of the self-timed signal st may be controlled by the falling edge of the clock signal ck. Note that hit timing should be predictable, in order to achieve maximum operating speed using a embodiment; in embodiments where the hit timing is not predictable, the width of the "low" level of the self-timed signal st must be sufficient to be longer than any possible ht delay.

Figure 4:
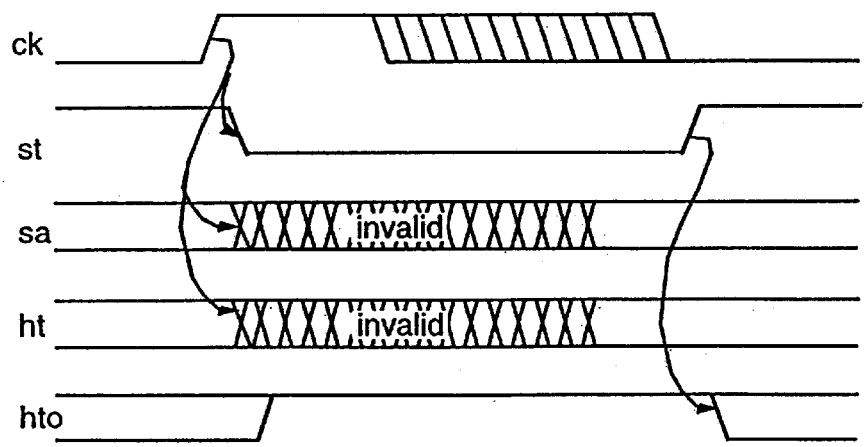
FIG. 4 is a timing chart showing self-timed signal and search results in one CAM array.
Figure 5A:
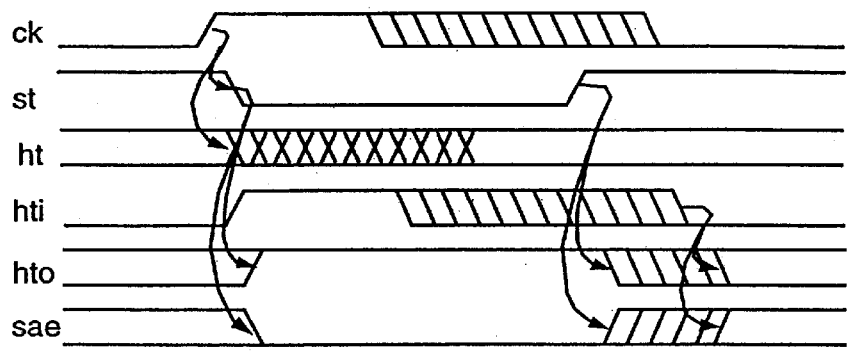
FIG. 5A is a timing chart showing relative timing of search signals responsive to the 0-1-0 transition of a propagation-in hit signal.
Figure 5B:
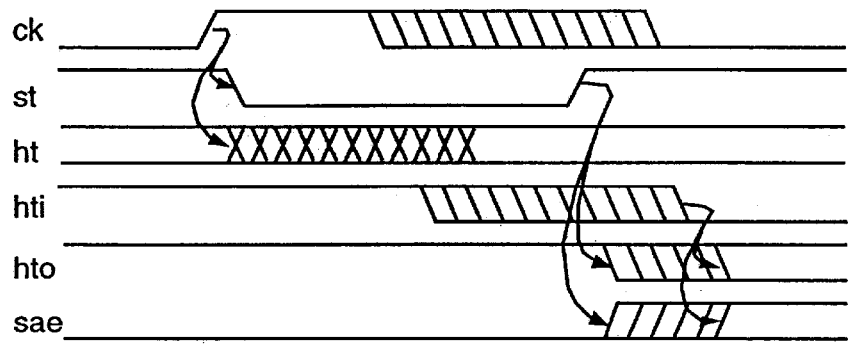
FIG. 5B is a timing chart showing relative timing of search signals responsive to the transition from 1 to 0 of the propagation-in hit signal.
Figure 5C:
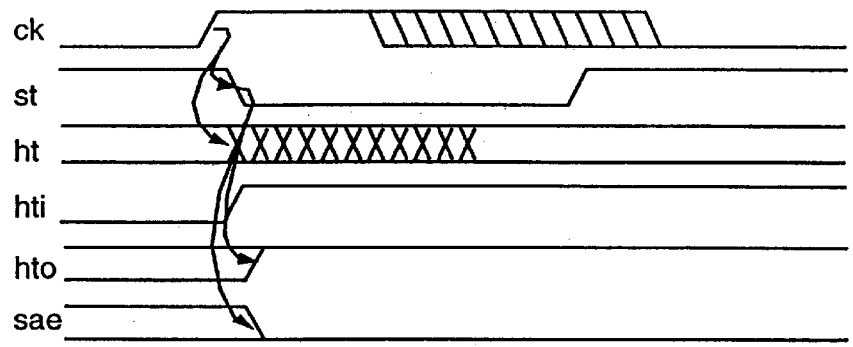
FIG. 5C is a timing chart showing relative timing of search signals responsive to the transition from 0 to 1 of the propagation-in hit signal.
Figure 5D:
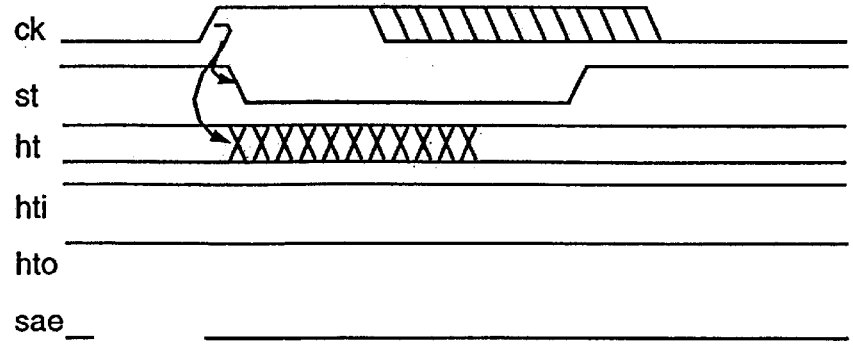
FIG. 5D is a timing chart showing relative timing of search signals responsive to the 1 logic level of the propagation-in hit signal.

FIG. 4 is a timing chart showing the self-timed signal and search results. The match address signal sa provided pulse from the CAM array 110 is fed to the transfer gate 334 which prevents the match address signal sa from passing through the gate 334 when the enable signal sae is low. An output signal from the transfer gate 334 is provided to the match address output terminal SA. A propagation-out hit signal hto provided from the OR gate 336 is fed to the buffer 338.

During the time interval when st=0 on all of the logic circuits 120 in the system, no arrays are enabled to drive the bus 122.

During the same interval, although the hit signal ht is logic 1, due st=0, the transfer of the match address signal sa by the transfer gate 334 is disabled. This partial redundancy may be removed by re-timing the signals and decreasing the number of inputs to the gates, without departing from the scope of this invention. Note that such an approach would lead to a less robust design.

Waveforms of all of the relevant signals on a single array are shown in FIGS. 5A–5D, for the four different cases of the propagation-in hit signal hti (0-1-0 transition, 1-0 transition, 0-1 transition, and 1 logic level).

As can be seen, correct operation is independent of (a) speed differences between arrays and (b) routing delay, because de-selection occurs based on logic local to the circuit 120, and only selection is gated by upstream signals. This feature also supports expandability, as additional arrays added to a system may be subject to different processing conditions, or even a completely different fabrication technology.

When worst-case timing is characterized, the slowest path to SA driving will be from the propagation-in hit signal at the terminal HTI. The downward transition on the propagation-in hit signal at the terminal HTI may further propagate to the propagation-out hit signal at the terminal HT (assuming ht=0), such that the worst-case system performance is equal to that of a single array standing alone, plus (n-2) times the propagation-in hit signal-to-HT delay plus the propagation-in signal-to-SA delay. System performance can be characterized by the following expressions:

$$tCH-SAV = tCH-HTV + (n-2) \times tHTIL-HTL + tHTIL-SAV$$

$$tCH-SHTV = tCH-HTV + (n-1) \times tHTIL-HTL$$

All timing parameters correspond to signals in FIGS. 1, 3, 4 and 5A–D.

tCH-SAV=time from upward transition on the clock signal ck to valid SA tCH-HTV=time from upward transition on the clock signal ck to HT valid for a single chip in isolation tHTIL-HTL=time from downward transition of HTI at a chip input to downward transition of HT at the same chip's output tHTIL-SAV=time from downward transition of HTI at a chip input to valid SA driven out from the same chip tCH-SHTV=time from an upward transition on the clock signal ck to valid SHT Note that, without the self-timed signal st, disabling and enabling SA drive would be dependent on HTI timing. Bus contention would be difficult to prevent, and disable timing would depend on an array's position in the cascade.

In another alternative embodiment, or simply an additional function, search address results may be stored in registers (not shown). The output of the encoder 130 may be used to determine which array's result register is read.

It is understood that there are many possible variations in embodiment detail that are logically subsumed by this invention disclosure, including different signal polarities, equivalent Boolean gatelevel implementations, small timing variations, and so on.

What is claimed is:

1. A system comprising:
   a common bus;
   a plurality of cascaded content addressable memory (CAM) arrays, each CAM array comprising encoding means and an array of core cells, of w words×b bits, associated with the encoding means, each CAM array being able to provide, through its respective encoding means, a hit signal and a match address signal resulting from a search operation in response to a clock signal; and
   a plurality of logic circuits, each logic circuit being associated with a respective CAM array to receive the hit signal and the match address signal provided therefrom, each logic circuit comprising:
   (i) timing signal generation means for generating a self-timed signal in response to the clock signal;
   (ii) hit propagation circuit for providing a propagation-out hit signal to a downstream logic circuit, by logically combining:
      a propagation-in hit signal provided from an upstream logic circuit;
      the hit signal provided from the respective CAM array; and
      the self-timed signal provided from the timing signal generation means; and
   (iii) match address transfer circuit for transferring the match address signal provided from the respective CAM array to the common bus.

2. The system of claim 1, wherein each hit propagation circuit comprises an OR gate having inputs for receiving the hit signal provided from the respective CAM array, the propagation-in hit signal provided from the upstream logic circuit and an inverted signal of the self-timed signal provided from the timing signal generation means.

3. The system of claim 1, wherein the timing signal generation means includes means for delaying the clock signal and means for generating the self-timed signal in response to a delayed clock signal and the clock signal.

4. The system of claim 1, wherein each match address transfer circuit comprises gate means for preventing more than one CAM array from transferring the match address signal to the common bus simultaneously, in response to:
  (i) the propagation-in hit signal provided from the upstream logic circuit;
  (ii) the hit signal provided from the respective CAM array: and
  (iii) the self-timed signal provided from the timing signal generation means.

5. The system of claim 6, wherein the gate means comprises a three-input AND gate having inputs for receiving the self-timed signal provided from the timing signal generation means, an inverted signal of the propagation-in hit signal provided from the upstream logic circuit and the hit signal provided from the respective CAM array.

6. The system of claim 1, further comprising means for providing the system hit and match address results of the cascaded CAM arrays, in response to the propagation-out hit signal provided from the furthest-downstream CAM array and the match address signal provided from the common bus.

7. The system of claim 6, further comprising determining means for determining priority of arrays in the cascaded CAM arrays, in response to the propagation-in hit signals and the propagation-out hit signals provided from the plurality of logic circuits.

8. The system of claim 7, wherein the determining means comprises an encoder and a plurality of logic gates associated with the logic circuits, each of the logic gates receiving the propagation hit-in signal and the propagation-out hit signal from a respective logic circuit and providing a logic result to the encoder, the encoder determining priority of arrays in the cascaded CAM arrays.

9. The system of claim 1, wherein:
  each of the plurality of CAM arrays is further able to provide, through its respective encoding means, a multiple match signal resulting from a search operation in response to the clock signal; and
  each of the plurality of logic circuits further comprises a multiple match propagation circuit for providing a propagation-out multiple match signal to a downstream logic circuit, in response to:
    the propagation-in hit signal provided from the upstream logic circuit;
    the hit signal provided from the respective CAM array;
    the multiple match signal provided from the respective CAM array; and
    a propagation-in multiple match signal provided from the upstream logic circuit.

10. The system of claim 9, further comprising means for observing a multiple match status of the cascaded CAM arrays in response to the propagation-out multiple match signal provided from the furthest-downstream array.

11. The system of claim 9, wherein each multiple match propagation circuit comprises a logic gate circuit for logically combining the propagation-in hit signal provided from the upstream logic circuit, the hit signal provided from the respective CAM array, the multiple match signal provided from the respective CAM array and the propagation-in multiple match signal provided from the upstream logic circuit.

12. The system of claim 11, wherein the logic gate circuit comprises:
  an AND gate having inputs for receiving the hit signal provided from the respective CAM array and the propagation-in hit signal provided from the upstream logic circuit; and
  an OR gate having inputs for receiving an output provided from the AND gate, the multiple match signal provided from the respective CAM array and the propagation-in multiple match signal provided from the upstream logic circuit.

* * * * *